(12) United States Patent
Lin

(10) Patent No.: US 6,384,683 B1
(45) Date of Patent: May 7, 2002

(54) HIGH PERFORMANCE INTERMEDIATE STAGE CIRCUIT FOR A RAIL-TO-RAIL INPUT/OUTPUT CMOS OPERATIONAL AMPLIFIER

(75) Inventor: Xijian Lin, Fremont, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 09/884,712

(22) Filed: Sep. 10, 2001

Related U.S. Application Data

(62) Division of application No. 09/735,216, filed on Dec. 12, 2000, now Pat. No. 6,300,834.

(51) Int. Cl.[7] .............................................. H03F 3/45
(52) U.S. Cl. ........................ 330/257; 330/255; 330/288
(58) Field of Search ................................ 330/255, 257, 330/288

(56) References Cited

U.S. PATENT DOCUMENTS

| | | | | |
|---|---|---|---|---|
| 5,055,719 A | * | 10/1991 | Hughes | 307/491 |
| 5,087,891 A | * | 2/1992 | Cytera | 330/288 |
| 5,134,310 A | * | 7/1992 | Mobley et al. | 307/270 |
| 5,644,269 A | * | 7/1997 | Wong et al. | 330/261 |

OTHER PUBLICATIONS

IEEE JSSC; vol. 29, No. 2; Feb. 1997; p. 169–176; Moldovan, Hua Harry Li; A Rail–to–Rail, Constant Gain, Buffered Op–Amp for Real Time Video Applications.

IEEE JSSC; vol. 29, No. 12; Dec. 1994; p. 1505–1513; Hogervorst, Tero, Eschauzier, Huijsing; A Compact Power–Efficient 3 V CMOS Rail–to–Rail Input/Output Operational Amplifier for VLSI Cell Libraries.

* cited by examiner

Primary Examiner—Robert Pascal
Assistant Examiner—Henry Choe
(74) Attorney, Agent, or Firm—Fliesler, Dubb, Meyer & Lovejoy, LLP

(57) ABSTRACT

An intermediate stage for a rail-to-rail input/output CMOS opamp includes a floating current source separating two current mirrors (151–154,155–158), where the ideal current source includes a floating current mirror (500,501,502,503, 504,505) enabling an output quiescent current to be provided which does not vary with changes in the voltage rails or the common-mode input voltage, and enabling elimination of input offset caused by the mismatch of the two current sources (164,166). The NMOS transistor (502) has a source-drain path provided in series with a PMOS transistor (505) serving to connect the current mirrors (151–154) and (155–158) and to eliminate input offset. The source of transistor (500) is separated from the $V_{SS}$ and $V_{DD}$ rails by a PMOS transistor 503 and current source (508) enabling the current mirror (500,501,502,503,504,505) to float so that transistors (502) and (505) will each have a gate to source bias voltage independent of changes in the voltage on the voltage supply rails $V_{DD}$ and $V_{SS}$ and independent of any input common-mode voltage offset. Voltage clamping transistors (600) and (602) can further be included to enable the current mirror transistors (151–154) and (155–158) to be low voltage devices to increase overall operation speed and device matching.

5 Claims, 8 Drawing Sheets

HIGH PERFORMANCE INTERMEDIATE STAGE CIRCUIT FOR A RAIL-TO-RAIL INPUT/OUTPUT CMOS OPERATIONAL AMPLIFIER

This application is a divisional of Ser. No. 09/735,216, filed Dec. 12, 2000, now U.S. Pat. No. 6,300,834.

BACKGROUND OF THE INVENTION

1. Field of the Invention

The present invention relates to a high performance intermediate stage for an operational amplifier (opamp), where the opamp accepts a rail-to-rail input voltage and provides a rail-to-rail output voltage. More particularly, the present invention relates to an intermediate stage with a floating current source used to bias two current mirrors, where the floating current source has circuitry configured to minimize input offset voltage and to provide currents which do not vary with changes in the voltage rails or the common-mode input voltage.

2. Background

FIG. 1 shows typical circuitry for an opamp which accepts a rail-to-rail input voltage, or voltage ranging between the $V_{DD}$ and $V_{SS}$ voltage supply rails, and provides a rail-to-rail output voltage. The circuit includes an input stage 100, an intermediate stage 150, and an output stage 190.

The input stage 100 is formed by transistors 101–104, a current source 106 and a current source 108. The gates of transistors 101 and 102 provide the inverting input $V_{IN}-$ for the opamp, while the gates of transistors 103 and 104 provide the noninverting input $V_{IN}+$. The current source 106 drives the sources of transistors 101 and 104, while the drains of transistors 101 and 104 provide current signals $I_{IP}+$ and $I_{IP}-$ to the intermediate stage 150. The current source 108 provides current to the sources of transistors 102 and 103, while the drains of transistors 102 and 103 provide current signals $I_{IN}-$ and $I_{IN}+$ to the intermediate stage. Transistors 101 and 104 are PMOS transistors as illustrated by the circle provided on their gate, while transistors 102 and 103 are NMOS devices without such a gate circle. The gate circles are used to show which transistors are PMOS and NMOS devices in the remaining transistors of FIG. 1, as well as in transistors in subsequent figures.

The intermediate stage 150 includes two current mirrors, a first current mirror with transistors 151–154, and a second current mirror with transistors 155–158. The intermediate stage also includes voltage supplies 160 and 162. The voltage supply 160 biases the gates of transistors 153 and 154, while the voltage supply 162 biases the gates of transistors 155 and 156.

The intermediate stage further includes a current source 164 set to provide a current to bias the gates of current mirror transistors 151 and 152 and to drive the drain of transistor 153. A current source 166 biases the gates of current mirror transistors 157 and 158 and provides current from the drain of transistor 155.

Outputs $I_{OP}$ and $I_{ON}$ of the intermediate stage are provided from the source and drain of transistors 170 and 180 with source-drain paths connected in parallel between the drains of transistors 154 and 156. Transistors 171 and 172 are diode connected transistors which set the bias voltage on the gate of transistor 170. A current source 173 drives the gate of transistor 170 as well as transistors 171 and 172. Transistors 181 and 182 are diode connected transistors which set the bias voltage on the gate of transistor 180. A current source 183 provides current to transistors 181 and 182 to bias the gate of transistor 180.

The output stage 190 includes output driver transistors 192 and 194 connected between the rails $V_{DD}$ and $V_{SS}$. The common drains of transistors 192 and 194 provide the output of the CMOS opamp of FIG. 1. The gate of transistor 192 is driven by the output $I_{OP}$ of the intermediate stage. The gate of transistor 194 is driven by the output $I_{ON}$ of the intermediate stage. A capacitor 196 is connected between the gate of transistor 192 and its drain to provide Miller Effect frequency compensation. Similarly, a capacitor 198 is provided between the gate and drain of transistor 194.

The intermediate stage provides a stable class A-B control for the output stage independent of common-mode input and supply rail voltages. A drawback to the circuit is that any mismatch between the current sources 164 and 166 will reflect forward as an input offset. The circuit of FIG. 1 is described in Hogervorst, et al., "A Compact Power-Efficient 3 V CMOS Rail-to-Rail Input/Output Operational Amplifier For VLSI Cell Libraries", *IEEE Journal Of Solid-State Circuits*, Vol. 29, No. 12, December 1994, which is incorporated herein by reference ('the Hogervorst reference').

FIG. 2 shows modifications to the intermediate stage circuit 150 of FIG. 1 to overcome the problem of input offset being reflected forward due to a mismatch between current sources 164 and 166. The intermediate stage circuit of FIG. 2 includes an ideal floating current source 200 which is used instead of current sources 164 and 166. The ideal floating current source 200 connects the gates of current mirror transistors 157–158 and drain of transistor 155 to the gates of current mirror transistors 151–152 and drain of transistor 153. The constant values of the floating current source 200 together with the current sources 171 and 173 control the output stage's quiescent current to be constant. Note that components carried over from FIG. 1 to FIG. 2 are similarly labeled, as are components carried over in subsequent figures.

FIG. 3 shows one implementation of circuitry to provide the ideal floating current source 200 of FIG. 2. The ideal floating current source includes two transistors 304 and 312 with source to drain paths connected in parallel between the drains of transistors 153 and 155. The gate of transistor 304 has a voltage set by diode connected transistors 300 and 302 and is driven by current source 306 to the $V_{DD}$ voltage rail. The gate of transistor 312 has a voltage set by diode connected transistors 308 and 310 and is connected by a current source 314 to the $V_{SS}$ voltage rail. As configured, the transistors 304 and 312 provide two identical current sources between current mirrors formed by transistors 151–154 and transistors 155–158, so that the current source transistors 304 and 312 do not reflect forward an input offset voltage, unlike the current sources 164 and 166 of FIG. 1 which may be mismatched.

The bias currents of transistors 304 and 312 will change when the common mode input cuts off one of the currents $I_{IN}-/I_{IN}+$ and $I_{IP}+/I_{IP}-$. If the input common mode value goes to $V_{SS}$, then $I_{IN}+/I_{IN}-$ will collapse to zero current. If that happens, the current mirror 155–158 will change DC operating voltage, and the PMOS transistor 312 will change its gate to source voltage, and therefore assume a new bias current to change the A-B point for the output stage. Similarly, if the input common mode value goes to $V_{DD}$, $I_{IP}+/I_{IP}-$ will collapse to zero current, the current mirror 151–154 will change operating voltage, and the NMOS transistor 304 will change its gate-to-source voltage. The NMOS transistor 304 will, therefore, assume a new bias current to change the A-B point for the output stage. The transistors 312 and 304 are, thus, sensitive to input common mode changes. The current of the floating current source will, thus, change with the common-mode input voltage, and therefore the quiescent current of the output stage will also change to compensate for the common mode input voltage. The circuitry of FIG. 3 is described in the Hogervorst reference cited previously.

FIG. 4 shows another circuit implementation for the ideal floating current source 200 of FIG. 2. The current source includes two transistors 402 and 404 with source to drain paths connected in series between the drains of transistors 153 and 155. The gate of transistor 402 is driven by a current source 405 and is further connected to one leg of a current mirror formed by transistors 406 and 407. The other leg of the current mirror formed by transistors 406 and 407 is connected to the gate of transistor 404. An additional diode connected transistor 410 connects the $V_{DD}$ power supply rail to the gate of transistor 404. As configured, the transistors 402 and 404 provide two identical current sources between current mirrors formed by transistors 151–154 and transistors 155–158, so that the current source transistors 402 and 404 do not reflect forward an input offset voltage, unlike the current sources 164 and 166 of FIG. 1 which may be mismatched. The circuit of FIG. 4 is described in Moldovan, et al., "A Rail-to-Rail Constant Gain, Buffered Op-Amp For Real Time Video Applications", *IEEE Journal Of Solid-State Circuits*, Vol. 32, No. 2, February 1997, which is incorporated herein by reference.

In FIG. 4, the value of the floating current source formed by transistors 402 and 404 is determined by the difference between the gate voltages of transistors 402 and 404. The gate to source voltage of transistor 410 relative to $V_{DD}$, and the gate to source voltage of transistor 406 relative to $V_{SS}$ serve to set the value of the gate voltage difference. Therefore, the value of the floating current source, and the output stage's quiescent current will also change significantly with changes in the supply voltage rails $V_{DD}$ and $V_{SS}$. The virtue of the circuit of FIG. 4 is that transistors 402 and 404 are in the saturation region, so a common-mode input change does not change the circuit quiescent operating point.

It is desirable to provide an intermediate stage for a rail-to-rail input/output CMOS opamp which does not have an output stage's quiescent current which varies with changes in the common-mode input voltage or the voltage rails, while still providing circuitry to minimize any input voltage offset.

SUMMARY OF THE INVENTION

In accordance with the present invention, circuitry is provided for an intermediate stage for a rail-to-rail input/output CMOS opamp which has an output quiescent current which does not vary with changes in the voltage rails and common-mode input voltage, and which eliminates input offset caused by the mismatch of the two current sources (164,166) in the circuit of FIG. 1.

In accordance with the present invention, an intermediate stage is provided which includes a floating current source. Referring to FIG. 5, the floating current source includes a floating current mirror made up of NMOS transistors 500, 501 and 502 and PMOS transistors 503, 504 and 505. The NMOS transistor 502 has a source-drain path provided in series with a PMOS transistor 505 serving to connect the current mirrors 151–154 and 155–158. As with the circuit of FIG. 3, the transistors 502 and 505 are biased to provide identical current sources serving to prevent input offset from being reflected forward, unlike with the two current sources 164 and 166 of FIG. 1 which may be mismatched. The transistors 502 and 505 are further biased to eliminate the problem occurring when the common mode input cuts off one of the currents $I_{IN}-/I_{IN}+$ and $I_{IP}+/I_{IP}-$, in a manner similar to the circuitry of FIG. 4.

The ideal current source in accordance with the present invention further includes a current source 508 providing current from the $V_{DD}$ voltage rail to the drain and gate of NMOS transistor 500. Unlike circuitry in FIG. 3, the source of transistor 500 is separated from the $V_{SS}$ rail by a PMOS transistor 503 enabling the current mirror transistors 500, 501, 502, 503, 504 and 505 to form a floating current mirror with a gate bias voltage independent of changes in the voltage on the voltage supply rails $V_{DD}$ and $V_{SS}$.

In further embodiments in accordance with the present invention, a floating current source can be created using transistors 500 and 503 in combination with transistors 501 and 504, similar to that shown in FIG. 5. As illustrated in FIGS. 6, the drain of PMOS transistor 503 can be connected to the $V_{SS}$ supply or some other bias point near it in voltage, as long as PMOS transistor 503 is maintained in saturation. In the same way, the drain of the NMOS transistor 500 can be connected to the $V_{DD}$ supply or some other bias point near it in voltage, as shown in FIG. 7. Further, either of transistors 500 or 503 can be connected in a diode configuration, although transistor 503 is shown in the diode configuration in FIG. 5.

The transistors 501, 504, 506 and 507 can be included to provide a stable voltage reference to replace voltage supplies 160 and 162 of FIG. 1. The transistors 501 and 504 are separated from the power supply rails $V_{DD}$ and $V_{SS}$ by diode connected transistors 506 and 507. The gate of transistor 506 provides a stable bias voltage to the gates of current mirror transistors 155 and 156, eliminating the need for the voltage supply 162 of FIG. 1. The gate of transistor 507 provides a stable bias voltage to the gates of transistors 153 and 154, eliminating the need for the voltage supply 160 of FIG. 1.

Referring to FIG. 8, an intermediate stage for an opamp in accordance with the present invention can include clamping transistors 800 and 802 to enable low voltage transistors to be used. The transistors 800 and 802 serve to clamp the drain-source voltage across transistors 154 and 156 to be less than the total gate-source voltages of transistors 181 and 800 and that of transistors 172 and 802, respectively. Without such clamping, the voltage across transistors 154 and 156 could be close to the $V_{DD}$ and $V_{SS}$ rails, respectively. Such clamping allows the current mirror transistors 151–154, and 155–158 to be low voltage devices, enabling higher operating speed and better device matching.

BRIEF DESCRIPTION OF THE DRAWINGS

The present invention will be described with respect to particular embodiments thereof, and references will be made to the drawings in which.

DETAILED DESCRIPTION

Figure 2:
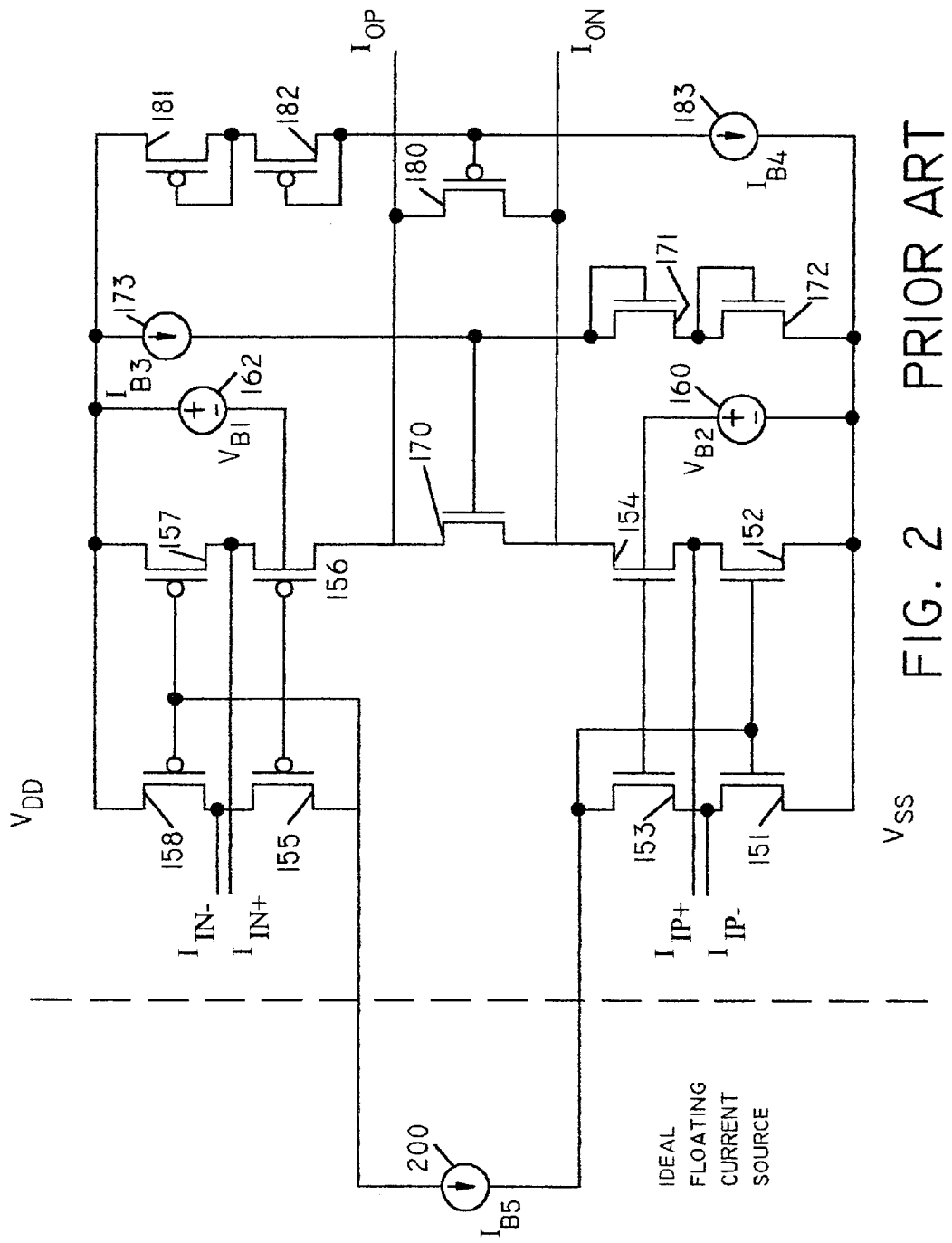
FIG. 2 shows modifications to the intermediate stage circuit of FIG. 1 to overcome the problem of input offset due to a mismatch between current sources in the intermediate stage.
Figure 5:
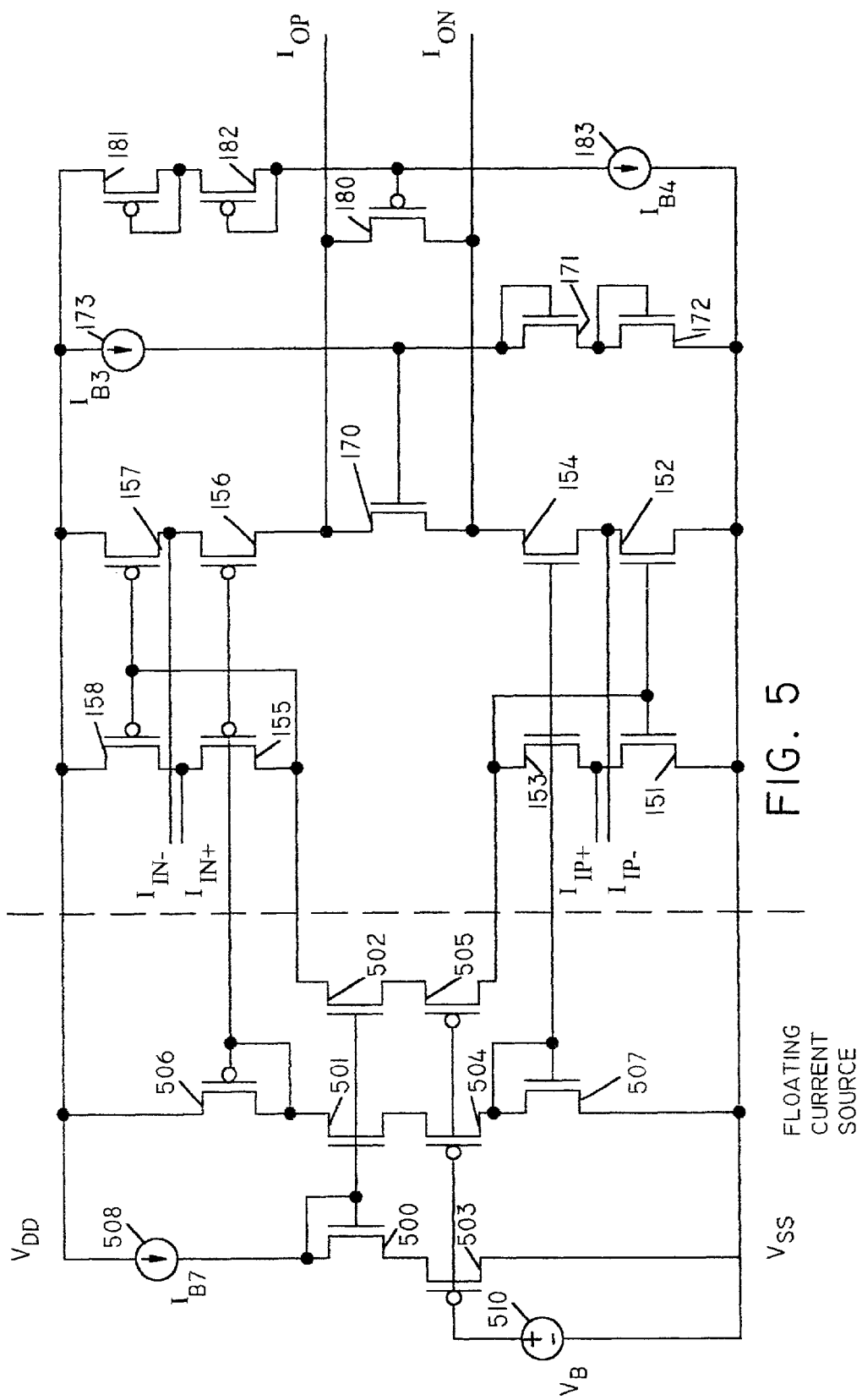
FIG. 5 shows an implementation of circuitry to provide the floating current source 200 of FIG. 2 in accordance with the present invention.

FIG. 5 shows a circuit implementation for the ideal floating current source 200 of FIG. 2 in accordance with the present invention. The circuit for the floating current source includes transistors 500–507, a current source 508 and a voltage source 510 to form a so-called floating current mirror to provide floating current sources. Two transistors 502 and 505 have sources connected to provide a floating current source between the drains of transistors 153 and 155. Two additional transistors 501 and 504 have sources connected in series to provide another floating current source to the drains of transistors 506 and 507.

The transistor 506 has a gate and drain connected in common and biases the current mirror transistors 155–158. The transistor 506, thus, provides a voltage reference to the gates of transistors 155 and 156, eliminating the need for the voltage reference 162 used in FIG. 1. Transistor 507 also has a gate and drain connected in common and biases the current mirror transistors 151–154. Transistor 507 eliminates the need for the voltage reference 160 of FIG. 1.

Figure 4:
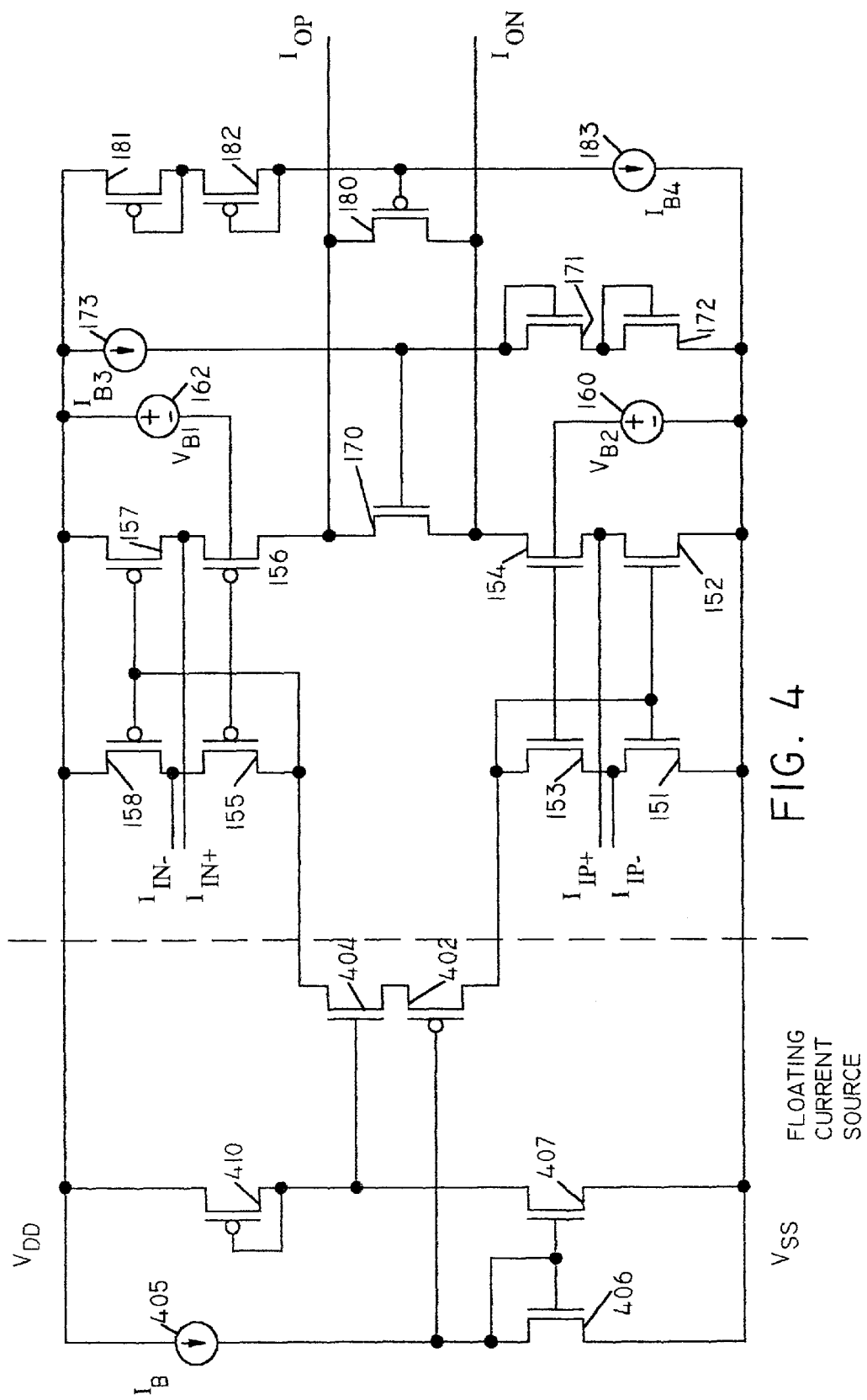
FIG. 4 shows another implementation of circuitry to provide the ideal current source of FIG. 2.

The transistor 500 has a gate and drain connected in common and forms a current mirror with transistors 501–505. The source and drain of transistor 500 are driven by current source 508. A transistor 503 biases the source of the transistor 500 above $V_{SS}$. The gates of transistors 503–505 are connected to the voltage reference 510. The voltage reference 510 has a voltage output set so that all of transistors 500–505 operate in their saturation regions. So, the common-mode input change does not change the quiescent current operating point as in FIG. 4.

The ideal current source circuitry of FIG. 5 includes two closed loops. A first loop is formed by transistors 500, 501, 503 and 504. A second loop is formed by transistors 500, 502, 503 and 505. The device ratios, or the ratio of the width (W) over length (L), for the transistors forming the first and second loops and the value of the current source 508 are set to control the values of the floating current sources 501,504 and 502,505. By design:

$$K_1 = (W/L)_{501}/(W/L)_{500} = (W/L)_{504}/(W/L)_{503}$$

$$K_2 = (W/L)_{502}/(W/L)_{500} = (W/L)_{505}/(W/L)_{503}$$

With $I_1$ being the current through the current source formed with transistors 501 and 504, ad $I_2$ being the current through the current source formed with transistors 502 and 505:

$$I_1 = K_1 * I_{508}$$

$$I_2 = K_2 * I_{508}$$

Since $K_1$ and $K_2$ and $I_{508}$ are constant, the ideal current source of FIG. 5 has the advantage that the currents of the floating current sources are independent of common-mode input and supply voltage changes.

Figure 1:
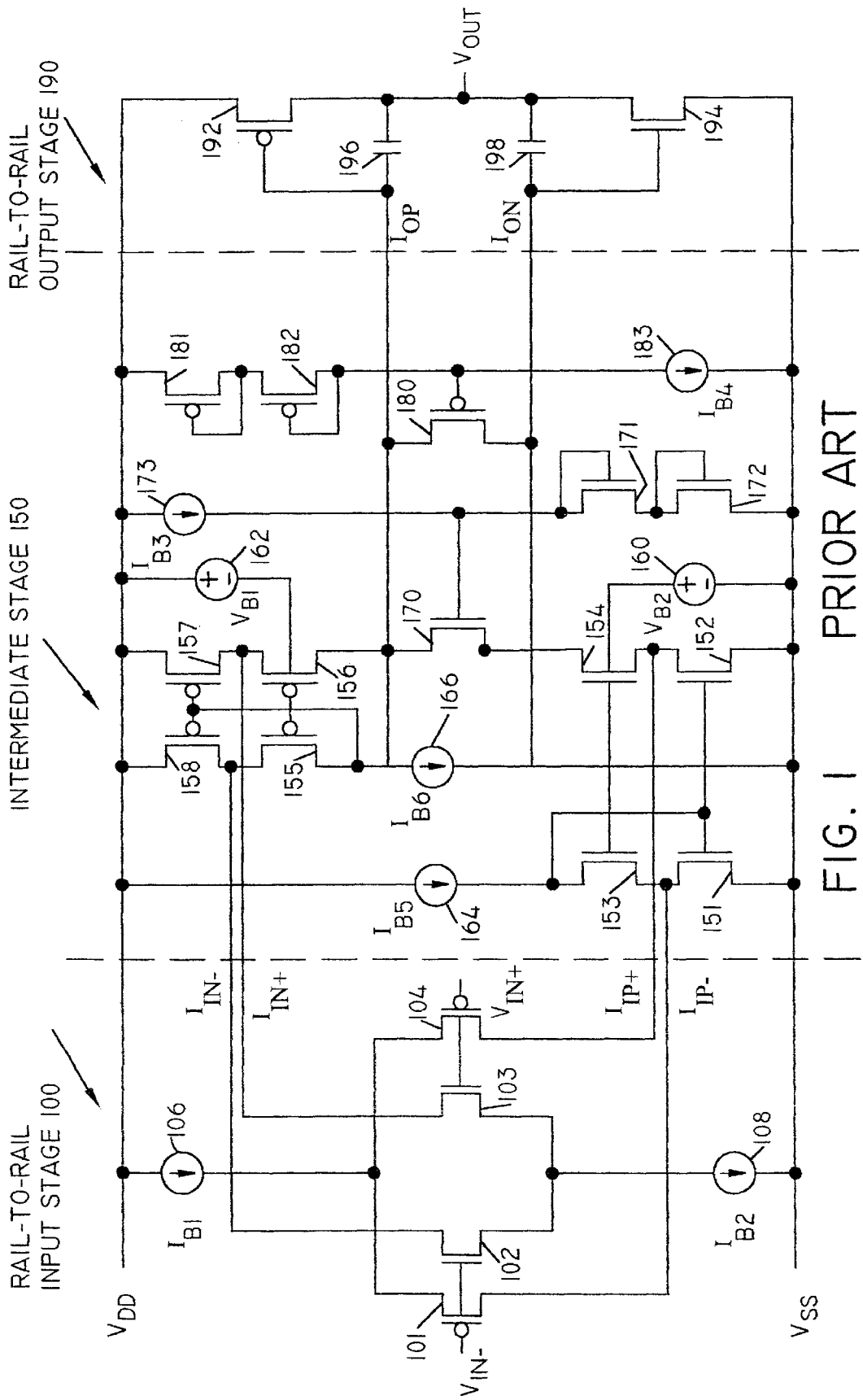
FIG. 1 shows typical circuitry for an opamp which accepts a rail-to-rail input voltage, or voltage ranging between the $V_{DD}$ and $V_{SS}$ voltage supply rails, and provides a rail to rail output voltage.

Transistors 506 and 507 provide the voltage references normally provided by independent voltage references, such as 160 and 162 of FIG. 1. The circuit of FIG. 5, thus, has the advantage that the intermediate stage is more compact.

Figure 3:
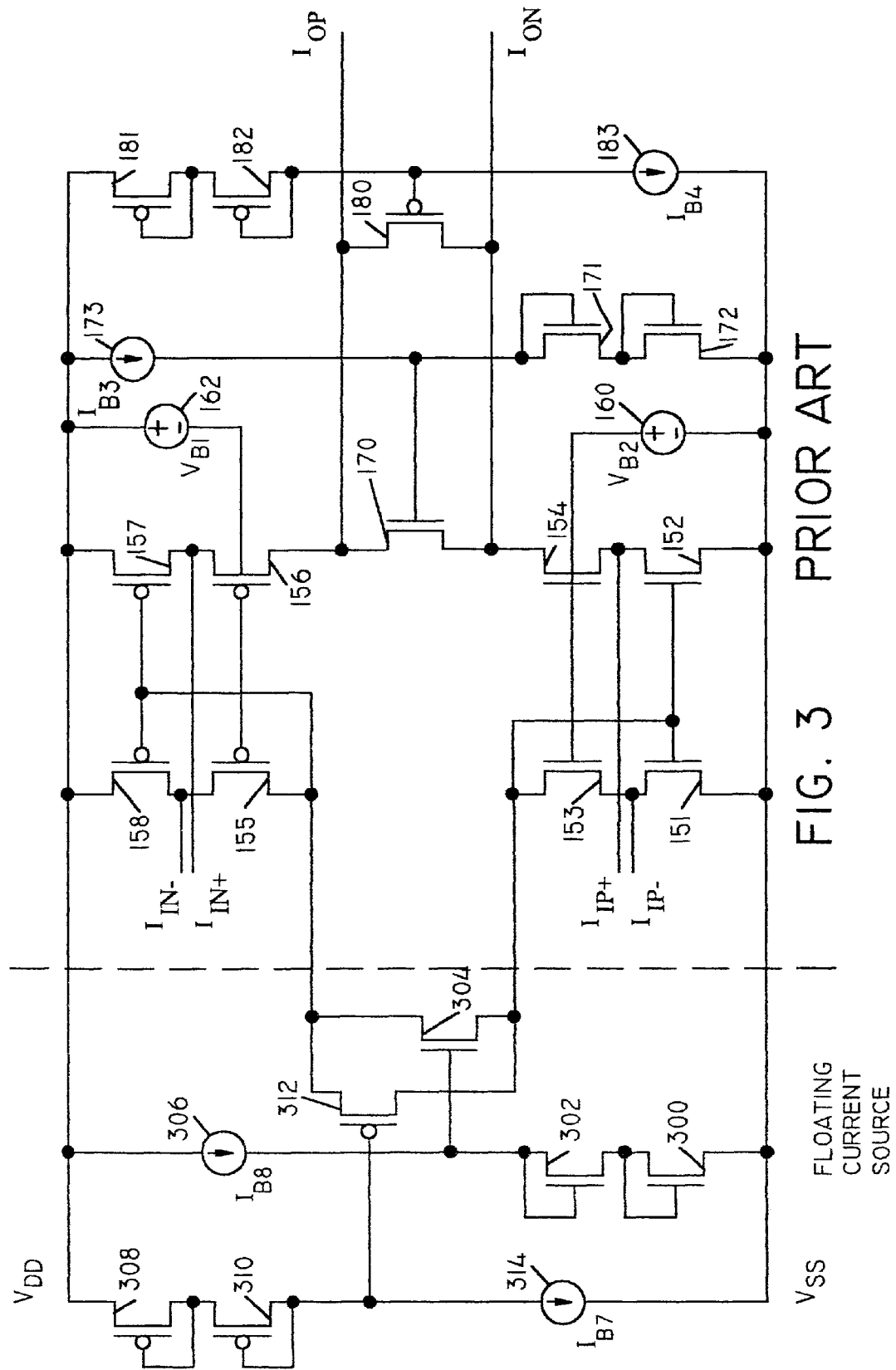
FIG. 3 shows one implementation of circuitry to provide the ideal current source of FIG. 2.

Input offset voltage is canceled with the circuit of FIG. 5 in a similar manner to the circuitry of FIG. 3. Since the drains of transistors 502 and 505 connect the current mirrors 151–154 and 155–158, and the drain currents are the same, input offset voltage will be canceled, unlike with the two current sources 164 and 166 of FIG. 1 which may be mismatched.

The current mirror transistor 500 being separated from the $V_{DD}$ and $V_{SS}$ voltage rails by a current source 508 and transistor 503 enables biasing to be provided independent of changes in $V_{DD}$ and $V_{SS}$. Similarly, transistors 501 and 504 being separated from the rails by transistors 506 and 507, and transistors 502 and 505 separated from the rails by current mirrors 151–154 and 155–158 enables operation to be independent of changes in $V_{DD}$ and $V_{SS}$.

Figure 7:
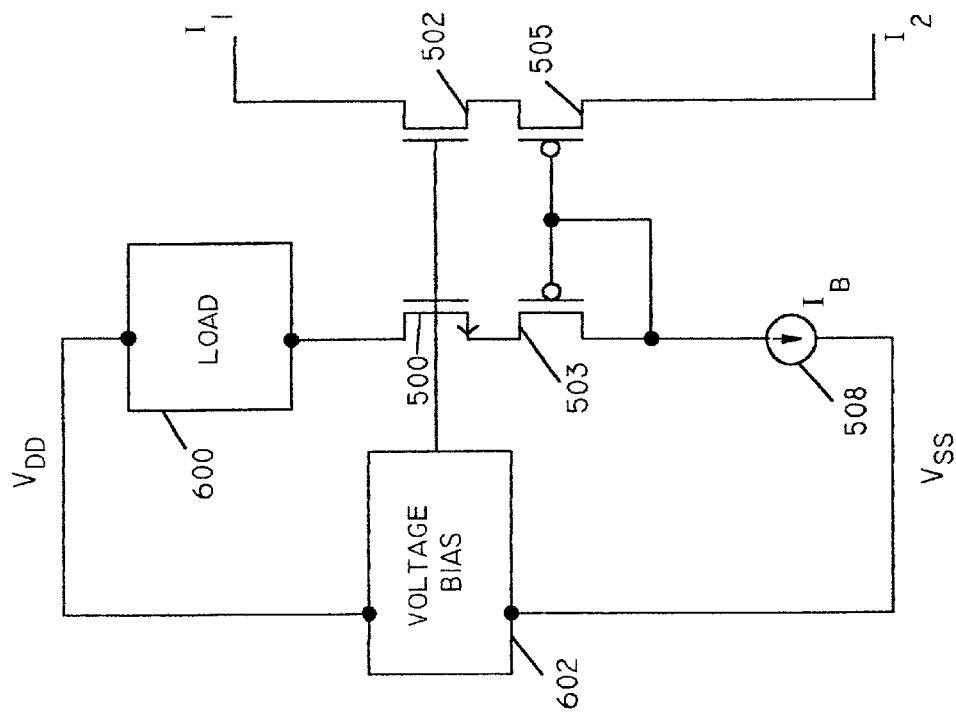
FIG. 7 shows a further generalized configuration for the floating current source 200 of FIG. 2.
Figure 6:
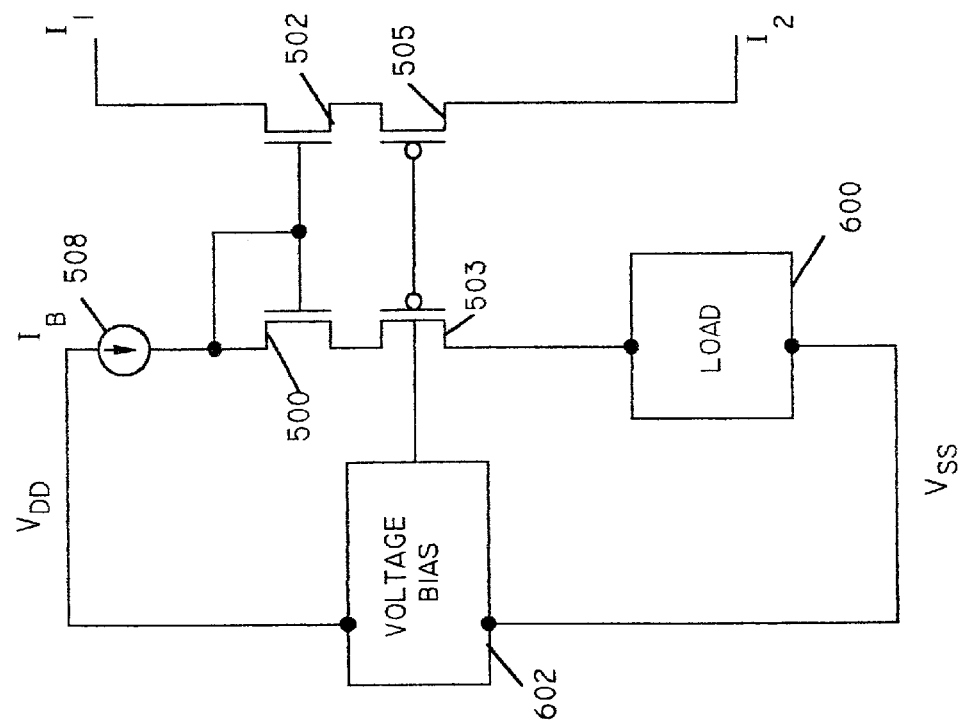
FIG. 6 shows a generalized configuration for the floating current source 200 of FIG. 2.

Additional embodiments for the floating current source 200 in accordance with the present invention are shown in a generalized form in FIGS. 6 and 7. FIGS. 6 and 7 utilize the series connected transistors 502 and 505 which have drains connected to current mirrors of the intermediate stage as shown in FIG. 5. FIGS. 6 and 7 further use series transistors 500 and 503 connected to form a floating current mirror with transistors 502 and 505. Transistors 501, 504, 506 and 507 may be included with the components of FIGS. 6 and 7, but are not shown. Components carried over from FIG. 5 to FIG. 6 are similarly labeled.

In FIG. 6, a current source $I_B$ flows from $V_{DD}$ to the drain of the NMOS transistor 500. Transistor 500 is diode connected and has a gate connected to the gate of NMOS transistor 502 to form a current mirror. Transistor 500 has a source connected in common with PMOS transistor 503. The voltage bias 602 operates similar to the voltage supply 510 of FIG. 5 to provide a bias voltage to the gates of PMOS transistors 503 and 505. Along with the load 600, the voltage bias 602 serves to keep all of transistors 500, 502, 503 and 505 operating in the saturation region. With the current source 508 and the load 600 separating the transistors 500 and 503 from the voltage rails $V_{DD}$ and $V_{SS}$, the transistors 500, 502, 503 and 505 form a floating current mirror. The drains of transistors 502 and 505 provide a floating current source $I_1$. By design, $$K = (W/L)_{502}/(W/L)_{500} = (W/L)_{505}/(W/L)_{503}$$

Here, W is the device width and L the device length. According to the closed loop formed by the gate-to-source voltages of 500,502,505 and 503, the value of the floating current source $I_1$ is equal to the product of the value of $I_B$ and K, i.e., $$I_1 = K * I_B$$

In the same way as transistors 500 and 503 are shown in FIG. 6, an additional pair of NMOS and PMOS devices can be added in parallel with transistors 502 and 505 to provide additional floating current source.

In FIG. 7, the current source $I_B$ flows from the drain of the PMOS transistor 503 to $V_{SS}$. Transistor 503, as opposed to transistor 500 in FIG. 6, is diode-connected and has a gate connected to the gate of PMOS transistor 505. The voltage bias 602 provides a bias voltage to the gates of NMOS transistors 500 and 502, as opposed to the PMOS transistors as in FIG. 6. The load 600 is connected to the drain of transistor 500. Transistor 500 has a source connected to the source of transistor 503. The operation of the floating current source is similar to that described with respect to FIG. 6, and will not be repeated.

Figure 8:
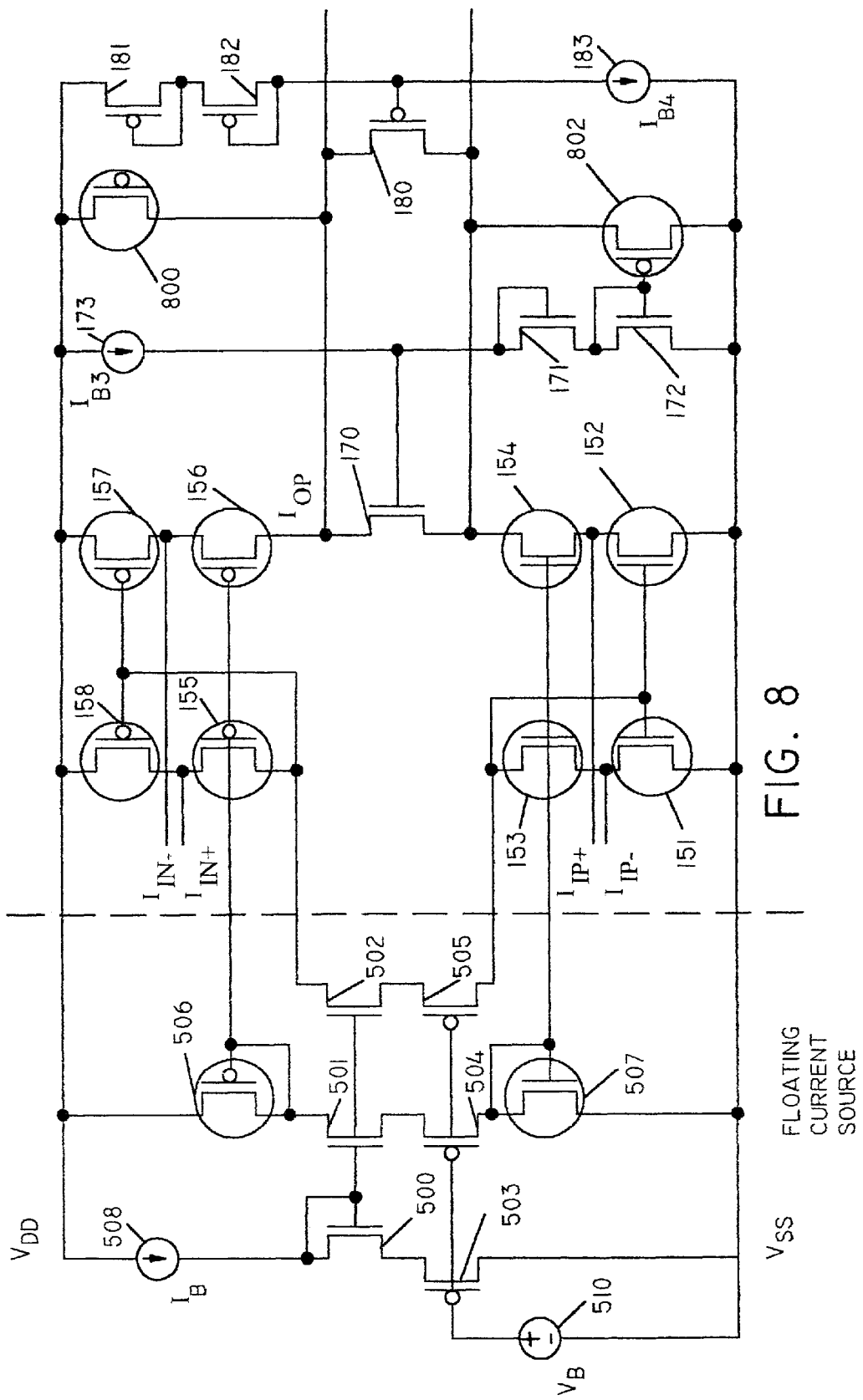
FIG. 8 shows a configuration of high and low voltage devices used with the circuitry of FIG. 5 to maximize performance for high voltage supply applications.

FIG. 8 shows a configuration of high and low voltage devices used with the circuitry of FIG. 5 to maximize performance for high voltage supply applications. In FIG. 8, the circled transistors are low voltage devices, whereas the other transistors are high voltage devices.

For high voltage applications, all circuit components should have high voltage breakdown protection. One design for such applications is to entirely use high-voltage devices. However, high-voltage devices employ a so-called drift-structure, and therefore have worse device matching, more parasitic capacitance and lower transconductance compared to conventional low-voltage devices with similar device sizes. As a result, an opamp using all high voltage devices will have a greater offset and less bandwidth. FIG. 8 shows a structure for an intermediate stage where low voltage devices can be used to provide a fast transient response while high voltage protection is maintained for the low voltage transistors.

The circuit of FIG. 8 modifies the circuit of FIG. 5 by adding voltage clamping transistors 800 and 802. Transistors 800 and 802 provide voltage clamping to protect transistors 154 and 156 from high-voltage breakdown. When the output transistor is driven hard, the drain-source voltages of transistors 154 and 156 would be close to the supply voltage if no clamping were provided. Transistors 154 and 156 would then suffer high voltage breakdown whenever the supply voltage is higher than their breakdown voltage. The clamping transistors 800 and 802 limit the drain-source voltages of transistors 154 and 156 to be less than the total gate-source voltages of transistors 181 and 800, and the total gate-source voltages of transistors 172 and 802, respectively. The gate-source voltages of the transistors 181,800 and 172,802 are controlled by device ratios and current sources 173,183 and are independent of variations in $V_{SS}$ and $V_{DD}$. The gate-source voltages of transistors 181,800 and 172,802 can, thus, be designed to limit the source-drain voltage across transistors 154 and 156 to a value lower than their breakdown voltage so that transistors 154 and 156 can be low voltage devices.

With the source-drain voltage across transistors 154 and 156 limited to a low voltage value, current mirrors 151–154 and 155–158 can be made up of low-voltage devices. The current mirrors will provide better device matching, and therefore contribute less to the input offset of the opamp. In addition, with the transistors of the current mirrors 151–154 and 155–158 being low voltage devices, the current mirrors will convert input currents $I_{IP}$+/− an $I_{IN}$+/− to output currents $I_{OP}$ and $I_{ON}$ much faster than high-voltage devices, resulting in more amplifier bandwidth.

Since transistor 506 tracks the current of transistor 156 and transistor 507 tracks the current of transistor 154, with the voltage across transistors 154 and 156 limited, the voltage across transistors 506 and 507 will be limited enabling transistors 506 and 507 to be low voltage devices.

Figure 9:
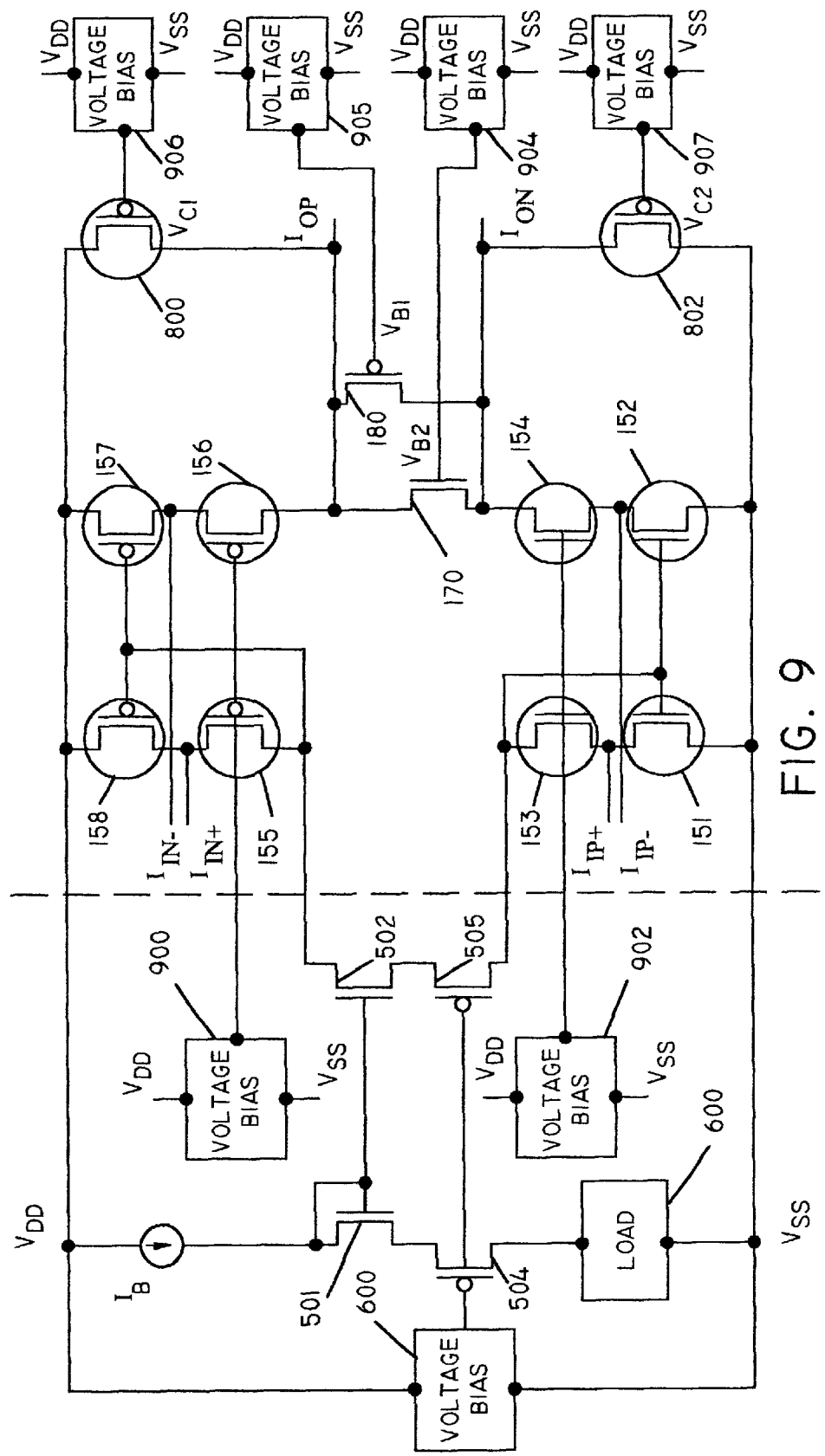
FIG. 9 shows an alternative configuration to the circuitry of FIG. 5 in a generalized form with high and low voltage devices used to maximize performance for high voltage applications.

FIG. 9 shows generalized components for the clamping circuit to illustrate that alternative circuitry to FIG. 8 components may be used for clamping in accordance with the present invention. The circuitry of FIG. 9 includes components for the floating current source of FIG. 6 as shown to the left of the dashed line in FIG. 9. Alternatively, the floating current source circuitry of FIG. 7 could be used. The circuitry to the left of the dashed line in FIG. 9 further includes voltage bias circuits 900 and 902, with the voltage bias circuit 900 driving the gates of current mirror transistors 155 and 156 and the voltage bias circuit 902 driving the gates of current mirror transistors 151 and 152. The voltage bias circuits 900 and 902 may include components such as the transistors 501, 504, 506 and 507 shown in FIG. 5, or other biasing circuitry as desired.

The floating current source transistors 502 and 505 are connected to current mirrors 151–154 and 155–158, similar to the connection in FIG. 8. Circles over the current mirror transistors 151–158 indicate that these can be low voltage devices, as in FIG. 8, while transistors without the circles are higher voltage devices. The current mirror outputs $I_{OP}$ and $I_{ON}$ are connected together by transistors 170 and 180, similar to FIG. 8, but biasing of the gates of transistors 170 and 180 is provided by general voltage bias circuits 904 and 905. The biasing circuits 904 and 905 are provided to show that different circuitry other than the components shown in FIG. 8 can be used for providing the voltages $V_{B1}$ and $V_{B2}$ to the gates of respective transistors 180 and 170. The circuit of FIG. 9 further includes voltage clamping transistors 800 and 802, similar to FIG. 8, but with the gates of transistors 800 and 802 biased using general voltage bias circuitry 906 and 907. The biasing circuits 906 and 907 show that different circuitry other than the components 181–183 and 171–173 can be used for providing voltages $V_{C1}$ and $V_{C2}$ to bias the gates of respective transistors 800 and 802.

The voltage biasing provided by biasing circuits 904–907 is designed to keep transistors 170 and 180 operating in the saturation regions and transistors 800 and 802 operating in the cutoff regions for the normal operation region of the opamp. When the opamp is in a hard-driven operation state, biasing circuits 904–907 put transistors 180 and 802 in their cutoff regions and transistors 170 and 800 in their saturation regions, or alternatively the biasing circuitry puts transistors 170 and 800 in their cutoff regions and transistors 180 and 802 in their saturation regions.

When the opamp is in the normal operation, transistors 800 and 802 are in their cutoff regions, and transistors 170 and 180 are in their saturation regions, so the voltage at the intermediate state output $I_{OP}$ is equal to $V_{B1}+Vgs_{180}$, where $Vgs_{180}$ is the gate to source voltage of transistor 180, and the voltage at the intermediate stage output $I_{ON}$ is equal to $V_{B2}-Vgs_{170}$, where $Vgs_{170}$ is the gate to source voltage of transistor 170. When the opamp is hard-driven, one case is that transistor 180 and transistor 802 are in their cutoff regions, and transistors 170 and 800 are in their saturation regions, so the voltage at the intermediate state output $I_{OP}$ is equal to $V_{C1}-Vgs_{800}$, and the voltage at the intermediate state output $I_{ON}$ is equal to $V_{B2}-Vgs_{170}$. Another case is that transistors 170 and 800 are in their cutoff regions, and transistors 180 and 802 are in their saturation regions, so the voltage at the intermediate stage output $I_{OP}$ is equal to $V_{B1}+Vgs_{180}$, and the voltage at the intermediate stage output $I_{ON}$ is equal to $V_{C2}+Vgs_{170}$. With the proper values for $V_{C1}$, $V_{C2}$, $V_{B1}$ and $V_{B2}$ set by design, the intermediate stage output voltages $I_{OP}$ and $I_{ON}$ can keep low-voltage transistors 154 and 156 from operating in a high-voltage breakdown region.

Although the present invention has been described above with particularity, this was merely to teach one of ordinary skill in the art how to make and use the invention. Many other modifications will fall within the scope of the invention, as that scope is defined by the claims provided below.

What is claimed is:

1. An intermediate stage for a CMOS operational amplifier comprising:
   a first current mirror receiving first differential inputs and having an first current mirror input;
   a second current mirror receiving second differential inputs and having a second current mirror input; and
   a floating current mirror comprising:
       a first NMOS transistor (500) having a drain coupled to a first power supply terminal through a load (600);
       a second NMOS transistor (502) having a drain connected to the first current mirror input and having a gate connected to the gate of the first NMOS transistor (500);
       a first PMOS transistor (503) having a drain and gate connected in common, and having a source coupled to the source of the first NMOS transistor (500);
       a second PMOS transistor (505) with a source connected to the source of the second NMOS transistor (502), and with a drain connected to the second current mirror input;
       a first voltage supply (602) having a first terminal coupled to the first power supply terminal and having a second terminal connected to the gates of the first NMOS transistor (500) and the second NMOS transistor (502); and
       a first current source (508) having a first terminal connected to the drain of the first PMOS transistor (503) and a second terminal connected to a second power supply terminal.

2. The intermediate stage for a CMOS operational amplifier of claim 1,
   wherein the first current mirror has an output providing a first output ($I_{OP}$) of the intermediate stage,
   wherein the second current mirror has an output providing a second output ($I_{ON}$) of the intermediate stage, and
   wherein the intermediate stage further comprises:
       a third NMOS transistor (170) having a drain connected to the first output ($I_{OP}$) of the intermediate stage, a source connected to the second output ($I_{ON}$) of the intermediate stage, and having a gate;
       a third PMOS transistor (180) having a source connected to the first output ($I_{OP}$) of the intermediate stage, a drain connected to the second output ($I_{ON}$) of the intermediate stage, and having a gate;
       a first voltage bias circuit (904) coupled to the gate of the third NMOS transistor (170); and
       a second voltage bias circuit (905) coupled to the gate of the third PMOS transistor (180).

3. The intermediate stage for a CMOS operational amplifier of claim 2 further comprising:
   a fourth NMOS transistor (800) having a drain coupled to the second power supply terminal, a source connected to the first output ($I_{OP}$) of the intermediate stage, and having a gate;
   a fourth PMOS transistor (802) having a drain coupled to the first power supply terminal, a source connected to the second output ($I_{ON}$) of the intermediate stage, and having a gate;
   a third voltage bias circuit (906) coupled to the gate of the fourth NMOS transistor (800); and
   a fourth voltage bias circuit (907) coupled to the gate of the fourth PMOS transistor (802).

4. The intermediate stage for a CMOS operational amplifier of claim 3,
   wherein the fourth NMOS transistor (800), the fourth PMOS transistor (802) and transistors of the first and second current mirrors are low voltage devices, and
   wherein the first and second NMOS transistors (502,500), the first and second PMOS transistors (505,503) are high voltage devices, each with a higher breakdown voltage than the low voltage devices.

5. An intermediate stage for a CMOS operational amplifier comprising:
   a first current mirror receiving first differential inputs and having a first current mirror input and an output;
   a second current mirror receiving second differential inputs and having a second current mirror input and an output;
   a floating current source comprising a floating current mirror coupling the first current mirror input to the second current mirror input, the floating current mirror functioning to cancel input offset current between the first and second differential inputs to provide a signal at the output of the first current mirror and the output of the second current mirror, the floating current mirror further being connected between $V_{DD}$ and $V_{SS}$ voltage rails and functioning to minimize current variations at the output of the first current mirror and the output of the second current mirror due to variations in the $V_{DD}$ and $V_{SS}$ voltage rails a first voltage clamping circuit connected from the $V_{DD}$ voltage rail to the output of the first current mirror; and a second voltage clamping circuit connected from the $V_{SS}$ voltage rail to the output of the second current mirror, wherein the transistors of the first and second current mirrors include low voltage transistors.

* * * * *